(12) United States Patent
Chen et al.

(10) Patent No.: US 11,290,136 B2
(45) Date of Patent: Mar. 29, 2022

(54) RADIO FREQUENCY DEVICE AND VOLTAGE GENERATING DEVICE THEREOF

(71) Applicant: RichWave Technology Corp., Taipei (TW)

(72) Inventors: Chih-Sheng Chen, Taipei (TW); Hsien-Huang Tsai, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/997,955

(22) Filed: Aug. 20, 2020

(65) Prior Publication Data

US 2021/0119651 A1 Apr. 22, 2021

(30) Foreign Application Priority Data

Oct. 16, 2019 (TW) ................................. 108137340

(51) Int. Cl.
*H04B 1/04* (2006.01)
*H03F 3/195* (2006.01)
*H03F 3/24* (2006.01)

(52) U.S. Cl.
CPC ............... *H04B 1/04* (2013.01); *H03F 3/195* (2013.01); *H03F 3/24* (2013.01); *H03F 2200/451* (2013.01); *H04B 2001/0408* (2013.01)

(58) Field of Classification Search
CPC ............... H04B 1/04; H03F 3/195; H03F 3/24
See application file for complete search history.

(56) References Cited

U.S. PATENT DOCUMENTS 3,942,039 A * 3/1976 Kikuchi ............. H03K 17/6874
327/389
5,717,356 A * 2/1998 Kohama ............. H03K 17/063
327/427

(Continued)

FOREIGN PATENT DOCUMENTS

CN 102147629 A * 8/2011
CN 108693904 A * 10/2018 ............ H02M 3/156

(Continued)

OTHER PUBLICATIONS

"Office Action of Taiwan Counterpart Application", dated Sep. 23, 2020, p. 1-p. 5.

*Primary Examiner* — Berhanu Tadese
(74) *Attorney, Agent, or Firm* — JCIPRNET (57) ABSTRACT

A radio frequency device and a voltage generating device thereof are provided. The voltage generating device includes a first transistor, a second transistor, and a voltage dividing circuit. A first terminal of the first transistor receives a first voltage. A first terminal of the second transistor receives a second voltage. A first connection terminal and a second connection terminal of the voltage dividing circuit are respectively coupled to second terminals of the first transistor and the second transistor. The voltage dividing circuit generates a first divided voltage and a second divided voltage. The first divided voltage is used as an output voltage of the voltage generating device. The second divided voltage is output as a control voltage to a control terminal of the first transistor and a control terminal of the second transistor.

20 Claims, 6 Drawing Sheets

(56) References Cited

U.S. PATENT DOCUMENTS

| | | | | |
|---|---|---|---|---|
| 7,173,471 B2 * | 2/2007 | Nakatsuka | H03K 17/04123 | 327/308 |
| 7,460,852 B2 * | 12/2008 | Burgener | H03K 17/063 | 455/333 |
| 7,796,969 B2 * | 9/2010 | Kelly | H03K 17/6871 | 455/333 |
| 8,093,940 B2 | 1/2012 | Huang et al. | | |
| 8,289,008 B2 * | 10/2012 | Chang | G05F 1/575 | 323/265 |
| 9,231,578 B2 * | 1/2016 | Chih-Sheng | H03K 17/007 | |
| 9,543,929 B2 * | 1/2017 | Chen | H03K 3/012 | |
| 9,590,500 B2 * | 3/2017 | Chen | H02M 1/36 | |
| 9,595,933 B2 * | 3/2017 | Zhao | H03F 3/21 | |
| 9,887,679 B2 * | 2/2018 | Zhao | H03F 3/195 | |
| 9,973,164 B1 * | 5/2018 | Long | H03F 3/45 | |
| 10,044,334 B2 * | 8/2018 | Long | H03F 1/0211 | |
| 10,044,335 B2 * | 8/2018 | Long | H03F 1/565 | |
| 10,284,084 B2 * | 5/2019 | Chen | H02M 3/156 | |
| 10,416,696 B2 * | 9/2019 | Chen | G05F 1/462 | |
| 10,812,053 B2 * | 10/2020 | Hayashi | H03K 3/012 | |
| 2006/0001473 A1 * | 1/2006 | Yasuda | H03K 17/693 | 327/415 |
| 2011/0254614 A1 * | 10/2011 | Huang | H03K 17/693 | 327/534 |
| 2012/0001604 A1 * | 1/2012 | Lee | G05F 1/575 | 323/273 |
| 2013/0176074 A1 * | 7/2013 | Chih-Sheng | H03K 17/007 | 327/530 |
| 2014/0253087 A1 * | 9/2014 | Chen | H03F 3/45085 | 323/313 |
| 2014/0253088 A1 * | 9/2014 | Chen | H03F 3/45085 | 323/315 |
| 2016/0087609 A1 * | 3/2016 | Chen | H03K 17/007 | 327/540 |
| 2016/0172969 A1 * | 6/2016 | Chen | H02M 3/24 | 327/536 |
| 2016/0241213 A1 * | 8/2016 | Zhao | H03F 1/0211 | |
| 2017/0141749 A1 * | 5/2017 | Zhao | H03F 3/45 | |
| 2018/0123539 A1 * | 5/2018 | Long | H03F 3/21 | |
| 2018/0138880 A1 * | 5/2018 | Long | H03F 1/565 | |
| 2018/0138881 A1 * | 5/2018 | Long | H03G 3/3042 | |
| 2018/0152146 A1 * | 5/2018 | Tai | H03F 3/21 | |
| 2018/0248353 A1 * | 8/2018 | Creech | H03K 17/04206 | |
| 2018/0294718 A1 * | 10/2018 | Chen | H02M 3/156 | |
| 2018/0299915 A1 * | 10/2018 | Chen | H03F 3/345 | |
| 2019/0163220 A1 * | 5/2019 | Chen | G05F 1/575 | |
| 2021/0119628 A1 * | 4/2021 | Tsai | G05F 1/585 | |
| 2021/0119651 A1 * | 4/2021 | Chen | H04B 1/04 | |

FOREIGN PATENT DOCUMENTS

| | | | | |
|---|---|---|---|---|
| CN | 108733124 A | * | 11/2018 | H02M 3/33523 |
| CN | 109839979 A | * | 6/2019 | G05F 1/59 |
| EP | 0720292 | | 7/1996 | |
| EP | 0720292 A1 | * | 7/1996 | H04B 1/48 |
| EP | 1487103 | | 12/2004 | |
| EP | 2341408 A2 | * | 7/2011 | G05F 1/563 |
| EP | 2613441 A1 | * | 7/2013 | H03K 17/007 |
| EP | 2341408 A3 | * | 5/2014 | G05F 1/575 |
| EP | 3032730 A1 | * | 6/2016 | H02M 3/24 |
| EP | 2341408 B1 | * | 10/2018 | G05F 1/575 |
| JP | 2000223902 | | 8/2000 | |
| JP | 2000223902 A | * | 8/2000 | |
| JP | 2001068984 | | 3/2001 | |
| JP | 2001068984 A | * | 3/2001 | |
| TW | 200744315 | | 12/2007 | |
| WO | 2007136050 | | 11/2007 | |
| WO | WO-2007136050 A1 | * | 11/2007 | H03K 17/165 |
| WO | 2012070162 | | 5/2012 | |
| WO | WO-2012070162 A1 | * | 5/2012 | H03K 17/567 |

* cited by examiner

RADIO FREQUENCY DEVICE AND VOLTAGE GENERATING DEVICE THEREOF

CROSS-REFERENCE TO RELATED APPLICATION

This application claims the priority benefit of Taiwan application serial no. 108137340, filed on Oct. 16, 2019. The entirety of the above-mentioned patent application is hereby incorporated by reference herein and made a part of this specification.

BACKGROUND OF THE DISCLOSURE

1. Field of the Disclosure

The disclosure relates to an electronic circuit, and in particular, to a radio frequency (RF) device and a voltage generating device thereof.

2. Description of Related Art

Many RF electronic products (such as a mobile phone, a wireless pager, wireless infrastructure, a satellite communication device, television equipment, and/or other RF products) are equipped with an RF circuit (such as an RF switcher, etc.) and others elements. A drive circuit may generate a control signal to change an RF transmission path of the RF switcher. Generally, a swing of the control signal depends on a power supply voltage of the drive circuit. One technical issue is how to generate a power supply voltage of a drive circuit by a voltage of a control signal.

It should be noted that the information disclosed in this Background section is only for enhancement of understanding of the background of the disclosure and therefore it may contain some information (or all information) that does not form the prior art that is already known to a person of ordinary skill in the art. Further, the information disclosed in the Background section does not mean that one or more problems were acknowledged by a person of ordinary skill in the art.

SUMMARY OF THE DISCLOSURE

The disclosure provides a radio frequency (RF) device and a voltage generating device thereof. The voltage generating device may generate an output voltage using a first voltage and (or) a second voltage.

The voltage generating device of the disclosure includes a first transistor, a second transistor, and a voltage dividing circuit. A first terminal of the first transistor is configured to receive a first voltage. A first terminal of the second transistor is configured to receive a second voltage. A first connection terminal and a second connection terminal of the voltage dividing circuit are coupled to a second terminal of the first transistor and a second terminal of the second transistor, respectively. The voltage dividing circuit divides a voltage of at least one of the first connection terminal and the second connection terminal to generate a first divided voltage and a second divided voltage. The first divided voltage is used as an output voltage of the voltage generating device. The second divided voltage is output as a control voltage to a control terminal of the first transistor and a control terminal of the second transistor.

An RF device of the disclosure includes a first transistor, a second transistor, a voltage dividing circuit, a voltage regulating unit, and an RF circuit. A first terminal of the first transistor is configured to receive a first voltage. A first terminal of the second transistor is configured to receive a second voltage. A first connection terminal and a second connection terminal of the voltage dividing circuit are coupled to a second terminal of the first transistor and a second terminal of the second transistor, respectively. The voltage dividing circuit divides a voltage of at least one of the first connection terminal and the second connection terminal to generate a first divided voltage and a second divided voltage. The second divided voltage is output as a control voltage to a control terminal of the first transistor and a control terminal of the second transistor. A voltage regulating unit is coupled to the voltage dividing circuit to receive a first divided voltage. The voltage regulating unit is configured to generate at least one of a positive voltage and a negative voltage related to the first divided voltage. The RF circuit is coupled to the voltage regulating unit to receive at least one of the positive voltage and the negative voltage. The RF circuit is configured to control an on state of at least one RF transmission path of the RF circuit according to the first voltage.

To make the features and advantages of the disclosure clear and easy to understand, the following gives a detailed description of embodiments with reference to accompanying drawings.

DESCRIPTION OF THE EMBODIMENTS

The term "coupled (or connected)" used in the entire specification (including the claims) may mean any direct or indirect connection means. For example, a first device coupled (connected) to a second device described herein should be interpreted as that the first device may be directly connected to the second device, or that the first device may be indirectly connected to the second device by other devices or by some means of connection. Terms such as "first" and "second" used in the entire specification (including the claims) are used to name components (elements) or to distinguish between different embodiments or ranges, and are not intended to define the upper or lower limit of the number of components or the order of components. Wherever possible, the same reference numbers are used in the drawings and the description to refer to the same or like parts, components or steps. For parts, components or steps denoted by same reference numbers or names, reference can be made to the related descriptions.

Figure 1:
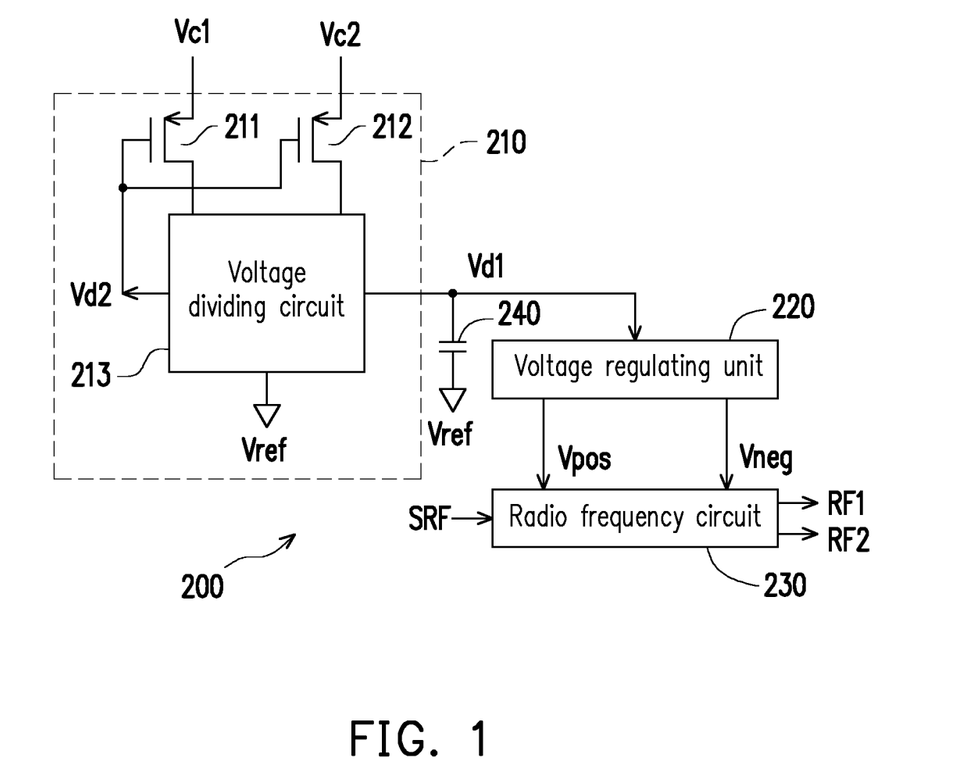
FIG. 1 is a schematic circuit block diagram of a radio frequency (RF) device according to an embodiment of the disclosure.

FIG. 1 is a schematic circuit block diagram of a radio frequency (RF) device 200 according to an embodiment of the disclosure. The RF device 200 shown in FIG. 1 includes a voltage generating device 210, a voltage regulating unit 220, and an RF circuit 230. In the embodiment shown in FIG. 1, the voltage generating device 210 includes a transistor 211, a transistor 212, and a voltage dividing circuit 213. The transistors 211 and 212 shown in FIG. 1 may be a p-channel metal oxide semiconductor (PMOS) transistor. According to a design demand, in other embodiments, the transistors 211 and 212 shown in FIG. 1 may be other transistors.

A first terminal (such as a source) of the transistor 211 may receive a control signal Vc1 (a first voltage). A first terminal (such as a source) of the transistor 212 may receive a control signal Vc2 (a second voltage). In other embodiments, the first terminal of the transistor 212 may receive a system voltage (a second voltage, such as a system voltage Vdd). In the embodiment shown in FIG. 1, the transistors 211 and 212 are low-voltage transistors. A gate-source breakdown voltage of the low-voltage transistor is less than a high logic level of any of the control signal Vc1 (the first voltage) and the control signal Vc2 (the second voltage).

A first connection terminal and a second connection terminal of the voltage dividing circuit 213 are coupled to a second terminal (such as a drain) of the transistor 211 and a second terminal (such as a drain) of the transistor 212, respectively. The voltage dividing circuit 213 divides a voltage of at least one of the first connection terminal and the second connection terminal to generate a divided voltage Vd1 and a divided voltage Vd2. According to a design demand, in some embodiments, the divided voltage Vd1 is greater than or equal to the divided voltage Vd2. In other embodiments, the divided voltage Vd1 may be less than the divided voltage Vd2. The divided voltage Vd1 may be used as an output voltage of the voltage generating device 210.

The divided voltage Vd2 may be used as a control voltage of the transistors 211 and 212. The divided voltage Vd2 is outputted to a control terminal (such as a gate) of the transistor 211 and a control terminal (such as a gate) of the transistor 212. For example, when the control signal Vc1 (the first voltage) is at a high logic level, and the control signal Vc2 (the second voltage) is at a low logic level, the transistor 211 transmits the control signal Vc1 to the voltage dividing circuit 213, and the voltage dividing circuit 213 divides a voltage of the control signal Vc1 to generate the divided voltage Vd1 and the divided voltage Vd2, so that the divided voltage Vd2 cuts off the transistor 212 and keeps the transistor 211 turning on or turns on the transistor 211.

The voltage generating device 210 may generate the divided voltage Vd1 and the divided voltage Vd2 by using the control signal Vc1 (the first voltage) and (or) the control signal Vc2 (the second voltage). Gate-source voltages of the transistors 211 and 212 may be adjusted through the divided voltage Vd2 generated by the voltage dividing circuit 213, to prevent the transistor 211 and (or) the transistor 212 from being broken down. For example, when the control signal Vc1 is at a high logic level (for example, 4.3 V), and the control signal Vc2 is at a low logic level (for example, 0 V), the transistor 211 is turned on/on, and the transistor 212 is cut off. The voltage dividing circuit 213 may divide a voltage of the control signal Vc1 (the first voltage) to generate a low divided voltage Vd2 (for example, 2 V) to a control terminal of the transistor 211 and to a control terminal of the transistor 212. Besides, the voltage level of the low divided voltage Vd2 should be low enough to keep the transistor 211 turning on but prevent the transistor 212 being breakdown. The gate-source voltages Vgs of the transistor 212 is 2 V–0 V=2 V, which does not exceed the gate-source breakdown voltage (for example, 3 V). Therefore, the transistor 212 could be prevented from being broken down. For an embodiment in which the transistor 211 is cut off, reference may also be made to related description of the transistor 212, and the descriptions thereof are omitted herein.

The voltage regulating unit 220 is coupled to the voltage dividing circuit 213 to receive the divided voltage Vd1. The voltage regulating unit 220 may generate at least one of a positive voltage Vpos and a negative voltage Vneg related to the divided voltage Vd1. The RF circuit 230 is coupled to the voltage regulating unit 220 to receive at least one of the positive voltage Vpos and the negative voltage Vneg. In some embodiments, the RF circuit 230 may control an on state of at least one RF transmission path of the RF circuit 230 according to the control signal Vc1 (the first voltage). For example, when the control signal Vc1 is in a first logic state, the RF transmission path of the RF circuit 230 may transmit an RF signal SRF to an RF transmission terminal RF1. When the control signal Vc1 is in a second logic state, the RF transmission path of the RF circuit 230 may transmit the RF signal SRF to an RF transmission terminal RF2.

In some other embodiments, the RF circuit 230 may control the on state of the at least one RF transmission path of the RF circuit 230 according to the control signal Vc1 and the control signal Vc2. For example, when the control signal Vc1 is in the first logic state, and the control signal Vc2 is in the second logic state, the RF transmission path of the RF circuit 230 may transmit the RF signal SRF to the RF transmission terminal RF1. When the control signal Vc1 is in the second logic state, and the control signal Vc2 is in the first logic state, the RF transmission path of the RF circuit 230 may transmit the RF signal SRF to the RF transmission terminal RF2. When both the control signal Vc1 and the control signal Vc2 are in the first logic state, the RF transmission path of the RF circuit 230 may transmit the RF signal SRF to the RF transmission terminal RF1 and the RF transmission terminal RF2. When both the control signal Vc1 and the control signal Vc2 are in the second logic state, the RF circuit 230 does not transmit the RF signal SRF to the RF transmission terminal RF1 and the RF transmission terminal RF2.

According to a design demand, in some embodiments, the RF device 200 may further selectively include a capacitor 240. A first terminal of the capacitor 240 is coupled to the voltage dividing circuit 213 to receive the divided voltage Vd1. A second terminal of the capacitor 240 is coupled to a reference potential Vref (for example, a ground voltage GND). The capacitor 240 may suppress noise during switch of the control signal Vc1 and the control signal Vc2 between logic states to provide a relatively stable divided voltage Vd1.

Figure 2:
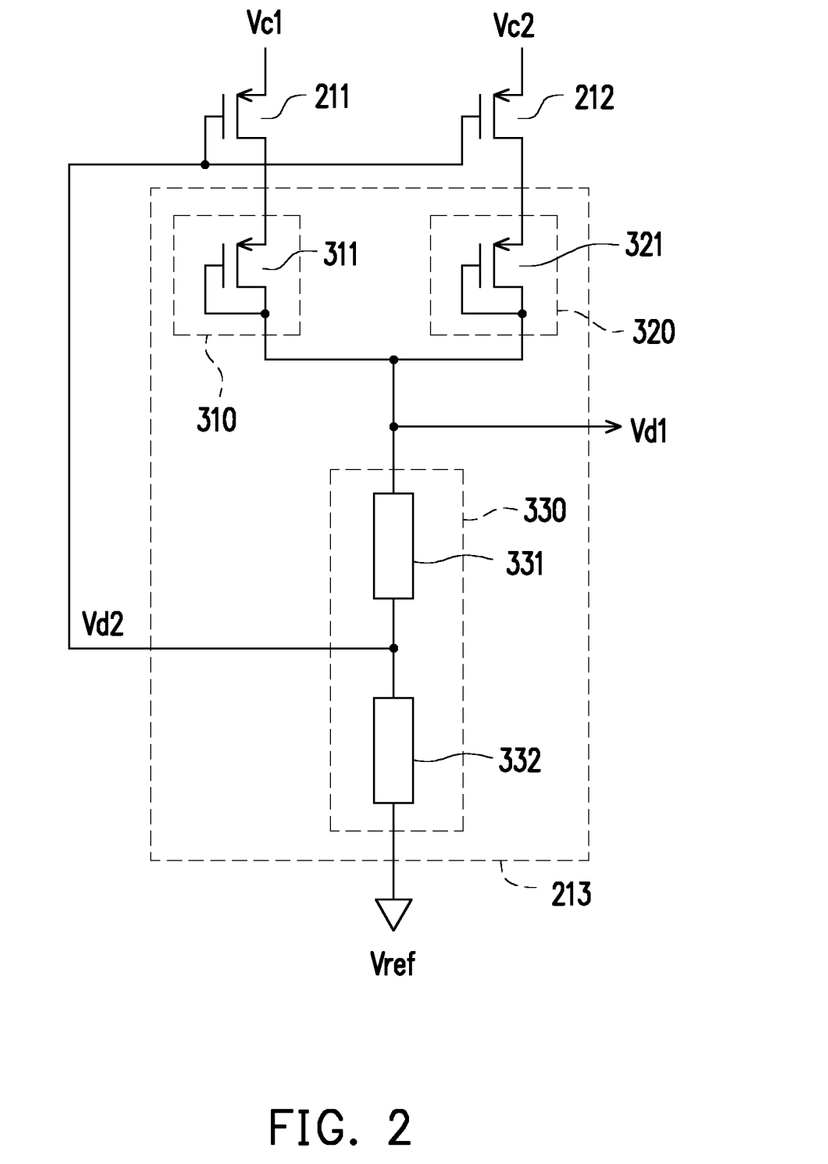
FIG. 2 is a schematic circuit block diagram illustrating a voltage dividing circuit shown in FIG. 1 according to an embodiment of the disclosure.

FIG. 2 is a schematic circuit block diagram illustrating a voltage dividing circuit 213 shown in FIG. 1 according to an embodiment of the disclosure. In the embodiment shown in FIG. 2, the voltage dividing circuit 213 includes a diode circuit 310, a diode circuit 320, and a voltage divider 330. An anode of the diode circuit 310 is coupled to a first connection terminal of the voltage dividing circuit 213, so as to be coupled to a transistor 211. In some embodiments, the diode circuit 310 may include one diode. In some other embodiments, the diode circuit 310 may include a diode string formed by a plurality of serially connected diodes. In the embodiment shown in FIG. 2, the diode circuit 310 may include a diode-connected transistor 311. A first terminal (such as a source) of the transistor 311 may be used as to the anode of the diode circuit 310. A control terminal (such as a gate) of the transistor 311 is coupled to a second terminal (such as a drain) of the transistor 311. The second terminal of the transistor 311 may be used as a cathode of the diode circuit 310.

An anode of the diode circuit 320 is coupled to a second connection terminal of the voltage dividing circuit 213, so as to be coupled to the transistor 212. A cathode of the diode circuit 320 is coupled to the cathode of the diode circuit 310 to provide a divided voltage Vd1. In some embodiments, the diode circuit 320 may include one diode. In some other embodiments, the diode circuit 320 may include a diode string formed by a plurality of serially connected diodes. In the embodiment shown in FIG. 2, the diode circuit 320 may include a diode-connected transistor 321. A first terminal (such as a source) of the transistor 321 may be used as the anode of the diode circuit 320. A control terminal (such as a gate) of the transistor 321 is coupled to a second terminal (such as a drain) of the transistor 321. The second terminal of the transistor 321 may be used as a cathode of the diode circuit 320.

A first terminal of the voltage divider 330 is coupled to the cathodes of the diode circuits 310 and 320. A second terminal of the voltage divider 330 is coupled to a reference potential Vref (for example, a ground voltage GND). The voltage divider 330 may divide a voltage of the divided voltage Vd1 to generate a divided voltage Vd2 to be provided to the control terminals of the transistors 211 and 212. In the embodiment shown in FIG. 2, the voltage divider 330 may include an impedance circuit 331 and an impedance circuit 332. A first terminal of the impedance circuit 331 is coupled to the first terminal of the voltage divider 330, so as to be coupled to the diode circuits 310 and 320. In some embodiments, the impedance circuit 331 may include one diode (or resistor). In some other embodiments, the impedance circuit 331 may include a plurality of diodes (and/or a plurality of resistors) that are serially connected to each other.

A first terminal of the impedance circuit 332 is coupled to a second terminal of the impedance circuit 331 to provide a divided voltage Vd2. A second terminal of the impedance circuit 332 is coupled to the second terminal of the voltage divider 330, so as to be coupled to the reference potential Vref. In some embodiments, the impedance circuit 332 may include one diode (or resistor). In some other embodiments, the impedance circuit 332 may include a plurality of diodes (and/or a plurality of resistors) that are serially connected to each other.

Figure 3:
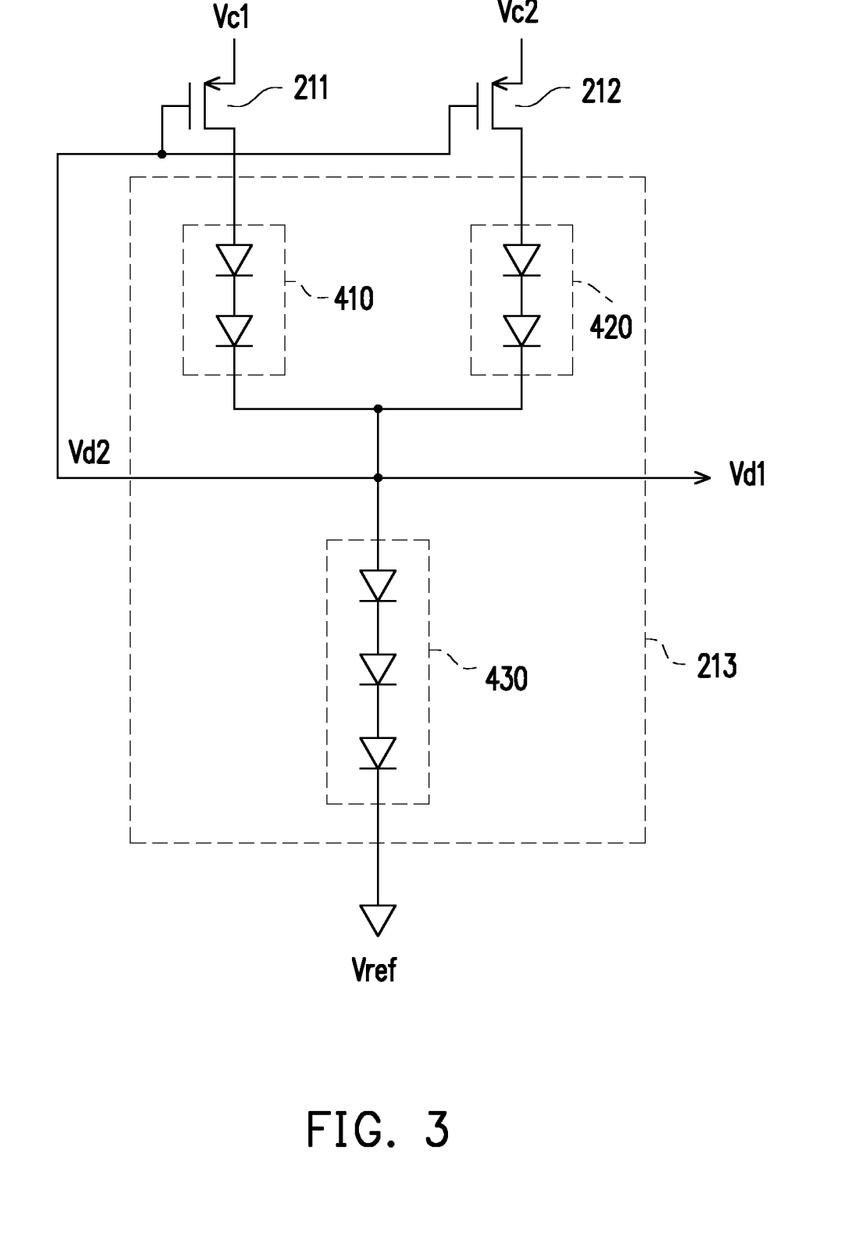
FIG. 3 is a schematic circuit block diagram illustrating a voltage dividing circuit shown in FIG. 1 according to another embodiment of the disclosure.

FIG. 3 is a schematic circuit block diagram illustrating a voltage dividing circuit 213 shown in FIG. 1 according to another embodiment of the disclosure. In the embodiment shown in FIG. 3, a voltage divider 213 includes an impedance circuit 410, an impedance circuit 420, and an impedance circuit 430. A first terminal of the impedance circuit 410 is coupled to a first connection terminal of the voltage dividing circuit 213, so as to be coupled to a transistor 211. In some embodiments, the impedance circuit 410 may include one diode (or resistor). In some other embodiments, the impedance circuit 410 may include at least one diode and at least one resistor that are serially connected to each other. In the embodiment shown in FIG. 3, the impedance circuit 410 includes a diode string formed by a plurality of serially connected diodes. A quantity of the diodes may be determined according to a design demand.

A first terminal of the impedance circuit 420 is coupled to a second connection terminal of the voltage dividing circuit 213, so as to be coupled to a transistor 212. In some embodiments, the impedance circuit 420 may include one diode (or resistor). In some other embodiments, the impedance circuit 420 may include at least one diode and at least one resistor that are serially connected to each other. In the embodiment shown in FIG. 3, the impedance circuit 420 includes a diode string formed by a plurality of serially connected diodes. A quantity of the diodes may be determined according to a design demand.

A first terminal of the impedance circuit 430 is coupled to a second terminal of the impedance circuit 410 and a second terminal of the impedance circuit 420, to provide a divided voltage Vd1 and a divided voltage Vd2. A second terminal of the impedance circuit 430 is coupled to a reference potential Vref. In some embodiments, the impedance circuit 430 may include one diode (or resistor). In some other embodiments, the impedance circuit 430 may include at least one diode and at least one resistor that are serially connected to each other. In the embodiment shown in FIG. 3, the impedance circuit 430 includes a diode string formed by a plurality of serially connected diodes. A quantity of the diodes may be determined according to a design demand.

Figure 4:
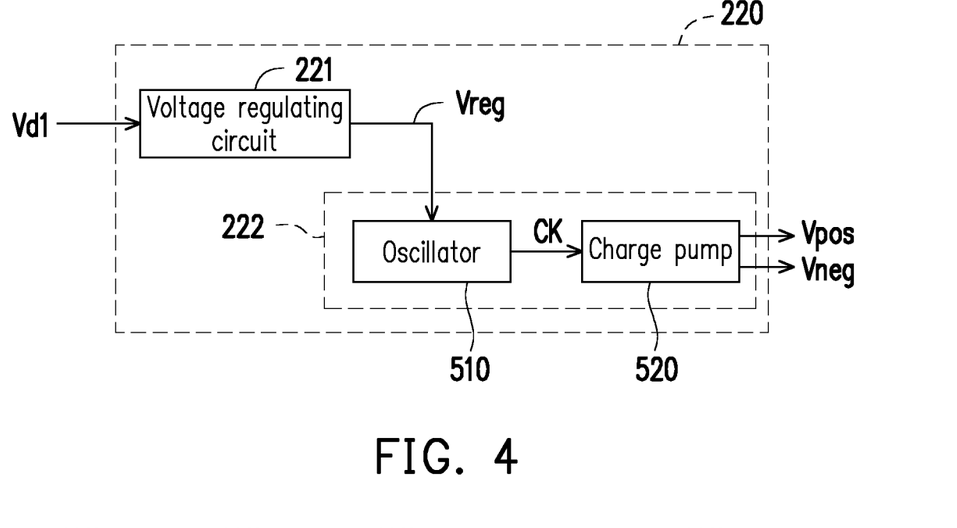
FIG. 4 is a schematic circuit block diagram illustrating a voltage regulating unit shown in FIG. 1 according to an embodiment of the disclosure.

FIG. 4 is a schematic circuit block diagram illustrating a voltage regulating unit 220 shown in FIG. 1 according to an embodiment of the disclosure. In the embodiment shown in FIG. 4, the voltage regulating unit 220 includes a voltage regulating circuit 221 and a voltage generating circuit 222. The voltage regulating circuit 221 is coupled to a voltage dividing circuit 213 to receive a divided voltage Vd1 as a power supply voltage. The voltage regulating circuit 221 may generate a regulating voltage Vreg. According to a design demand, the voltage regulating circuit 221 may include a voltage regulator, a DC-to-DC converter, or other voltage regulating circuits. A level of the regulating voltage Vreg may be determined according to a design demand.

The voltage generating circuit 222 is coupled to the voltage regulating circuit 221 to receive the regulating voltage Vreg. The voltage generating circuit 222 may generate at least one of a positive voltage Vpos and a negative voltage Vneg related to the regulating voltage Vreg. In the embodiment shown in FIG. 4, the voltage generating circuit 222 includes an oscillator 510 and a charge pump 520. The oscillator 510 is coupled to the voltage regulating circuit 221 to receive the regulating voltage Vreg. The oscillator 510 may generate a clock signal CK related to the regulating voltage Vreg. In the embodiment, an implementation of the oscillator 510 is not limited. For example, according to a design demand, the oscillator 510 may include a known oscillating circuit or other oscillating circuits. A frequency of the clock signal CK may be determined according to a design demand.

The charge pump 520 is coupled to the oscillator 510 to receive the clock signal CK. The charge pump 520 may generate the positive voltage Vpos and/or the negative voltage Vneg according to the clock signal CK. In the embodiment, an implementation of the charge pump 520 is not limited. For example, according to a design demand, the charge pump 520 may include a known charge pump circuit or other charge pump circuits. Levels of the positive voltage Vpos and the negative voltage Vneg may be determined according to a design demand.

Figure 5:
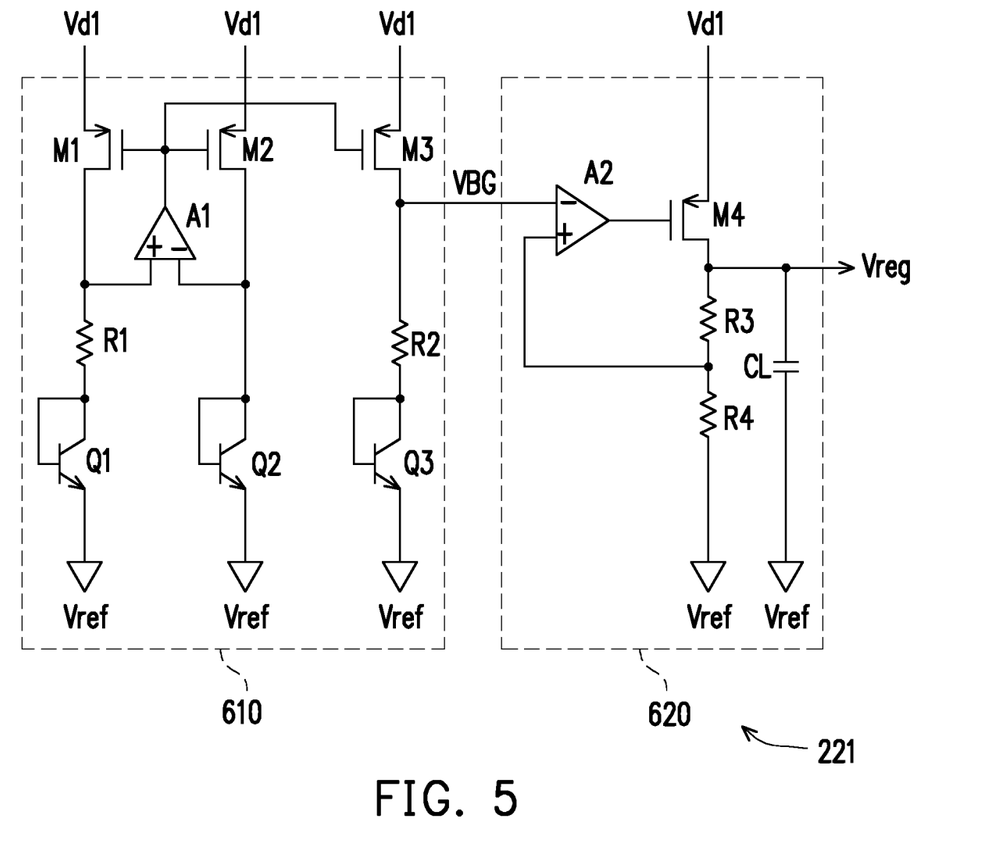
FIG. 5 is a schematic circuit block diagram of illustrating a voltage regulating circuit shown in FIG. 4 according to an embodiment of the disclosure.

FIG. 5 is a schematic circuit block diagram illustrating a voltage regulating circuit 221 shown in FIG. 4 according to an embodiment of the disclosure. In the embodiment shown in FIG. 4, the voltage regulating circuit 221 includes a bandgap circuit 610 and a low drop-out (LDO) voltage regulator 620. The bandgap circuit 610 includes a transistor M1, a transistor M2, a transistor M3, a transistor Q1, a transistor Q2, a transistor Q3, an amplifier A1, a resistor R1, and a resistor R2. The low drop-out voltage regulator 620 includes an amplifier A2, a transistor M4, a resistor R3, a resistor R4, and a capacitor CL. A power supply terminal of the bandgap circuit 610 is coupled to a voltage dividing circuit 213 to receive a divided voltage Vd1. The bandgap circuit 610 may generate a bandgap voltage VBG. The low drop-out voltage regulator 620 is coupled to the bandgap circuit 610 to receive the bandgap voltage VBG. The low drop-out voltage regulator 620 may generate a regulating voltage Vreg related to the bandgap voltage VBG.

Figure 6:
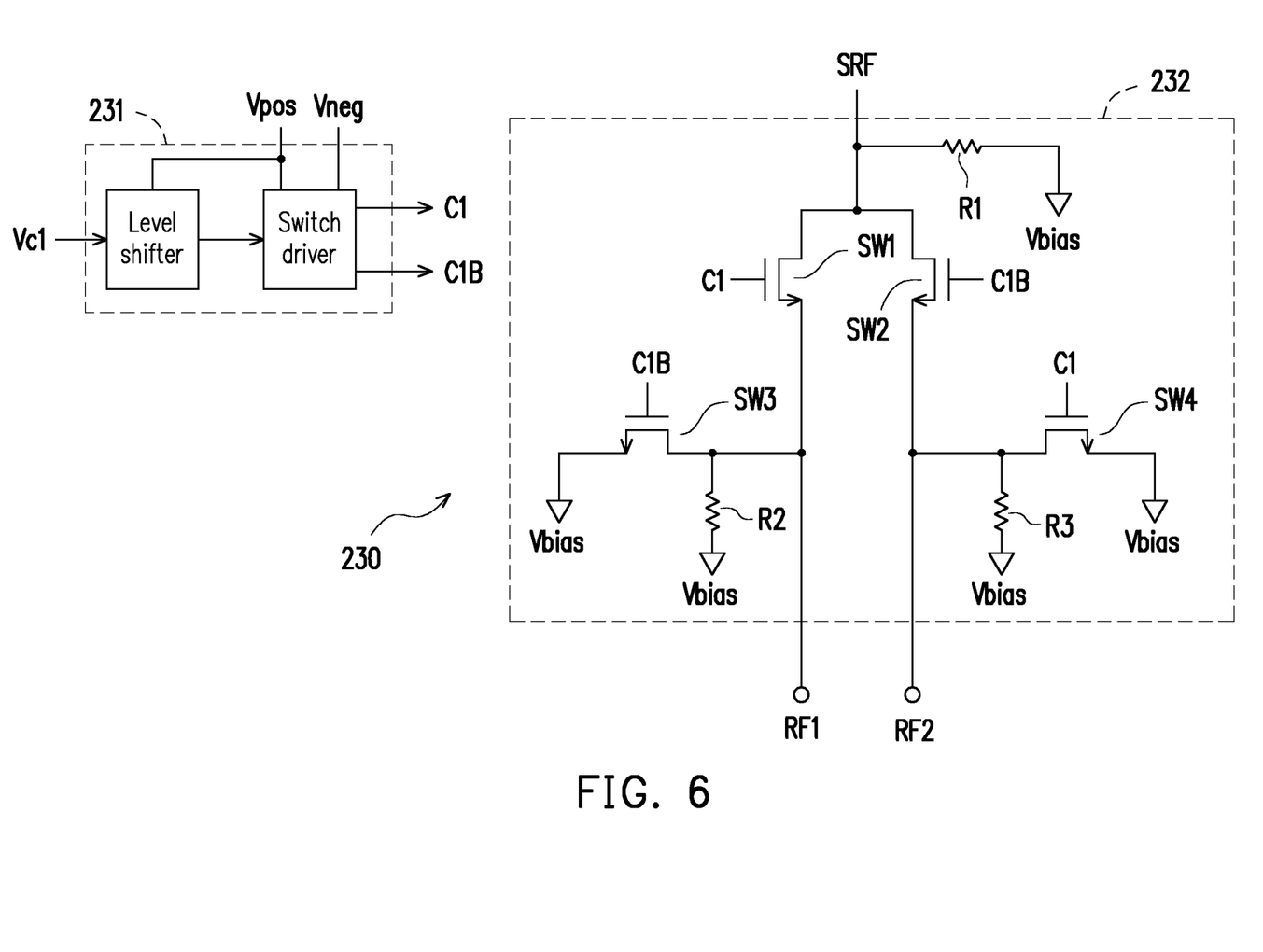
FIG. 6 is a schematic circuit block diagram of a illustrating an RF circuit shown in FIG. 1 according to an embodiment of the disclosure.

FIG. 6 is a schematic circuit block diagram illustrating an RF circuit 230 shown in FIG. 1 according to an embodiment of the disclosure. In the embodiment shown in FIG. 6, the RF circuit 230 includes a drive circuit 231 and an RF transmission circuit 232. A first power supply terminal of the drive circuit 231 is coupled to a voltage regulating unit 220 to receive a positive voltage Vpos. A second power supply terminal of the drive circuit 231 is coupled to the voltage regulating unit 220 to receive a negative voltage Vneg. The drive circuit 231 may generate a control voltage C1 and a control voltage C1B related to a control signal Vc1 (a first voltage).

For example, when the control signal Vc1 is at a high logic level, the drive circuit 231 may select to output the positive voltage Vpos as the control voltage C1, and select to output the negative voltage Vneg as the control voltage C1B. When the control signal Vc1 is at a low logic level, the drive circuit 231 may select to output the negative voltage Vneg as the control voltage C1, and select to output the positive voltage Vpos as the control voltage C1B.

The RF transmission circuit 232 is coupled to the drive circuit 231 to receive the control voltage C1 and the control voltage C1B. The RF transmission circuit 232 may control an on state of an RF transmission path according to the control voltage C1 and the control voltage C1B. In the embodiment shown in FIG. 6, the RF transmission path includes a first path and a second path. The RF transmission circuit 232 includes an RF switch SW1, an RF switch SW2, a switch SW3, a switch SW4, a resistor R1, a resistor R2, and a resistor R3. A first terminal of the resistor R1 is coupled to a first terminal of the RF switch SW1 and a first terminal of the RF switch SW2. A second terminal of the resistor R1 is configured to receive a bias voltage Vbias. The first terminal of the RF switch SW1 may transmit an RF signal SRF. A second terminal of the RF switch SW1 is coupled to an RF transmission terminal RF1 of the RF transmission circuit 232. A control terminal of the RF switch SW1 is coupled to the drive circuit 231 to receive the control voltage C1. The RF switch SW1 may provide the first path. The first terminal of the RF switch SW2 may transmit an RF signal SRF. A second terminal of the RF switch SW2 is coupled to an RF transmission terminal RF2 of the RF transmission circuit 232. A control terminal of the RF switch SW2 is coupled to the drive circuit 231 to receive the control voltage C1B. The RF switch SW2 may provide the second path.

A first terminal of the resistor R2 is coupled to the second terminal of the RF switch SW1. A second terminal of the resistor R2 is configured to receive a bias voltage Vbias. A first terminal of the switch SW3 is coupled to the second terminal of the RF switch SW1. A control terminal of the switch SW3 is controlled by the control voltage C1B. A second terminal of the switch SW3 is configured to receive the bias voltage Vbias. A first terminal of the resistor R3 is coupled to the second terminal of the RF switch SW2. A second terminal of the resistor R3 is configured to receive a bias voltage Vbias. A first terminal of the switch SW4 is coupled to the second terminal of the RF switch SW2. A control terminal of the switch SW4 is controlled by the control voltage C1. A second terminal of the switch SW4 is configured to receive the bias voltage Vbias. The bias voltage Vbias may be, for example, a ground voltage GND or a fixed voltage.

When the control signal Vc1 is at a high logic level, the RF switch SW1 is conducted, and the RF switch SW2 is cut off. When the control signal Vc1 is at a low logic level, the RF switch SW1 is cut off, and the RF switch SW2 is conducted. According to logic states of the control signal Vc1 and the control signal Vc2, the RF signal SRF may be transmitted to the RF transmission terminal RF1 or the RF transmission terminal RF2.

Figure 7:
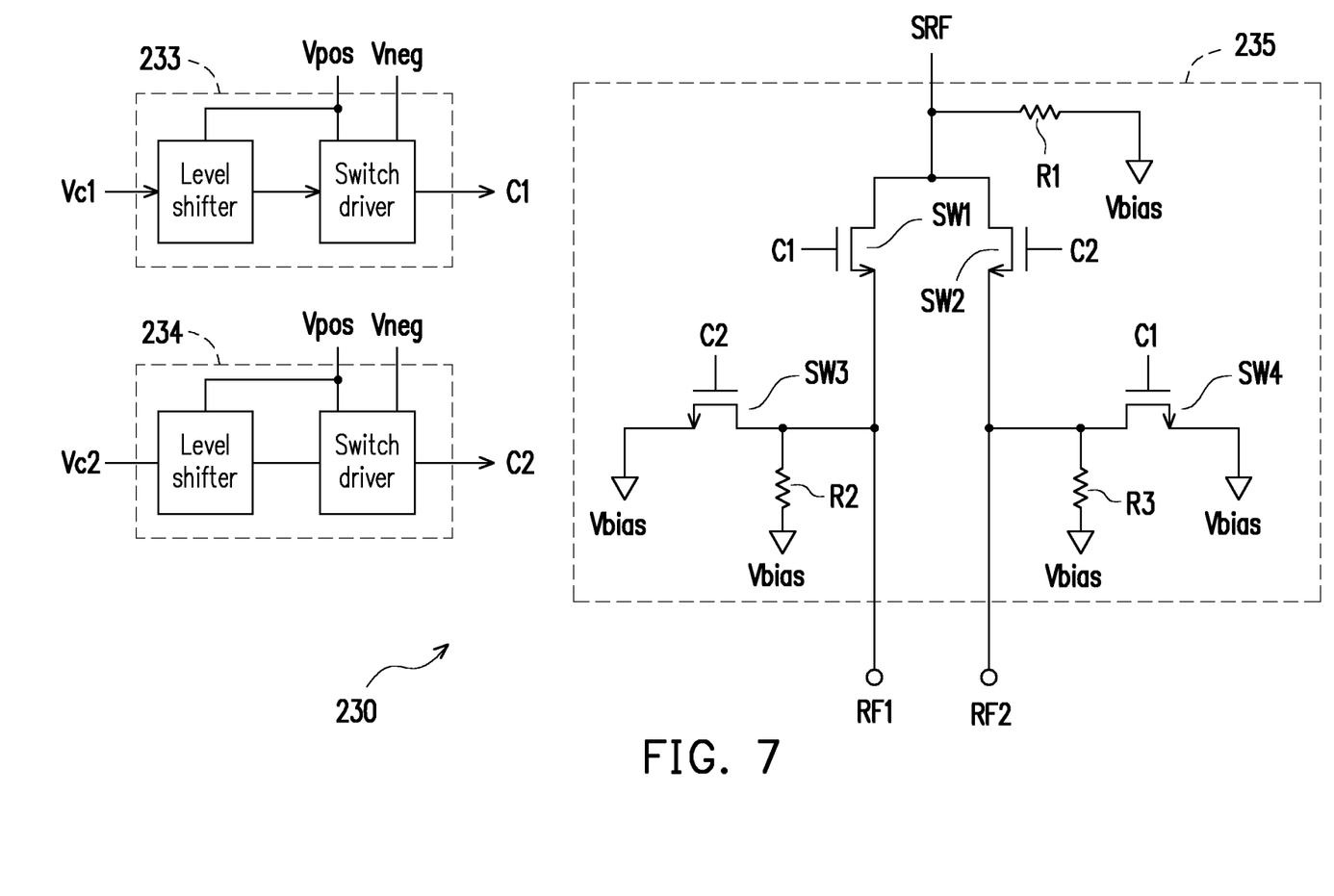
FIG. 7 is a schematic circuit block diagram illustrating an RF circuit shown in FIG. 1 according to another embodiment of the disclosure.

FIG. 7 is a schematic circuit block diagram illustrating an RF circuit 230 shown in FIG. 1 according to another embodiment of the disclosure. In the embodiment shown in FIG. 7, the RF circuit 230 includes a drive circuit 233, a drive circuit 234, and an RF transmission circuit 235. A first power supply terminal of the drive circuit 233 is coupled to a voltage regulating unit 220 to receive a positive voltage Vpos. A second power supply terminal of the drive circuit 233 is coupled to the voltage regulating unit 220 to receive a negative voltage Vneg. The drive circuit 233 may generate a control voltage C1 related to a control signal Vc1 (a first voltage). For example, when the control signal Vc1 is at a high logic level, the drive circuit 233 may select to output a positive voltage Vpos as the control voltage C1. When the control signal Vc1 is at a low logic level, the drive circuit 233 may select to output a negative voltage Vneg as the control voltage C1.

A first power supply terminal of the drive circuit 234 is coupled to the voltage regulating unit 220 to receive a positive voltage Vpos. A second power supply terminal of the drive circuit 234 is coupled to the voltage regulating unit 220 to receive a negative voltage Vneg. The drive circuit 234 may generate a control voltage C2 related to a control signal Vc2 (a second voltage). For example, when the control signal Vc2 is at a high logic level, the drive circuit 234 may select to output a positive voltage Vpos as the control voltage C2. When the control signal Vc2 is at a low logic level, the drive circuit 234 may select to output a negative voltage Vneg as the control voltage C2.

The RF transmission circuit 235 is coupled to the drive circuit 233 and the drive circuit 234 to receive the control voltage C1 and the control voltage C2. The RF transmission circuit 235 may control an on state of an RF transmission path according to the control voltage C1 and the control voltage C2. In the embodiment shown in FIG. 7, the RF transmission circuit 235 includes an RF switch SW1, an RF switch SW2, a switch SW3, a switch SW4, a resistor R1, a resistor R2, and a resistor R3. For the RF switch SW1, the RF switch SW2, the switch SW3, the switch SW4, the resistor R1, the resistor R2, and the resistor R3 shown in FIG. 7, reference may be made to the related descriptions of the RF switch SW1, the RF switch SW2, the switch SW3, the switch SW4, the resistor R1, the resistor R2, and the resistor R3 shown in FIG. 6, and the descriptions thereof are omitted herein. In the embodiment shown in FIG. 7, a control terminal of the RF switch SW1 is coupled to the drive circuit 233 to receive the control voltage C1. A control terminal of the RF switch SW2 is coupled to the drive circuit 234 to receive the control voltage C2. A control terminal of the switch SW3 is controlled by the control voltage C2. A control terminal of the switch SW4 is controlled by the control voltage C1.

Therefore, when both the control signal Vc1 and the control signal Vc2 are at a low logic level, both the RF switch SW1 and the RF switch SW2 are cut off. When the control signal Vc1 is at a high logic level, and the control signal Vc2 is at a low logic level, the RF switches SW1 and SW4 are conducted, and the RF switches SW2 and SW3 are cut off, and an RF signal SRF may be transmitted to an RF transmission terminal RF1. When the control signal Vc1 is at a low logic level, and the control signal Vc2 is at a high logic level, the RF switches SW1 and SW4 are cut off, and the RF switches SW2 and SW3 are conducted, and the RF signal SRF may be transmitted to an RF transmission terminal RF2. In other words, according to logic states of the control signal Vc1 and the control signal Vc2, the RF signal SRF may be transmitted to the RF transmission terminal RF1 or the RF transmission terminal RF2.

Based on the foregoing, the voltage generating device 210 in the embodiments of the disclosure may generate the divided voltage Vd1 and the divided voltage Vd2 using the first voltage (such as the control signal Vc1) and/or the second voltage (such as the control signal Vc2 or a system voltage Vdd). The divided voltage Vd1 may be used as an output voltage of the voltage generating device 210, and the divided voltage Vd2 may be used as a control voltage of the transistor 211 and the transistor 212. Gate-source voltages of the transistors 211 and 212 may be adjusted through the divided voltage Vd2 generated by the voltage dividing circuit, to prevent the transistor 211 and (or) the transistor 212 from being broken down.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A voltage generating device, comprising:
   a first transistor having a first terminal that is configured to receive a first voltage;
   a second transistor having a first terminal that is configured to receive a second voltage; and
   a voltage dividing circuit having a first connection terminal and a second connection terminal that are coupled to a second terminal of the first transistor for receiving the first voltage via the first transistor and a second terminal of the second transistor for receiving the second voltage via the second transistor, respectively, wherein the voltage dividing circuit divides a voltage of at least one of the first connection terminal and the second connection terminal to generate a first divided voltage and a second divided voltage, the first divided voltage is used as an output voltage of the voltage generating device, and the second divided voltage is output as a control voltage to a control terminal of the first transistor and a control terminal of the second transistor.

2. The voltage generating device according to claim 1, wherein the first voltage is a first control signal, and the second voltage is a second control signal or a system voltage.

3. The voltage generating device according to claim 1, wherein when the first voltage is at a high logic level, and the second voltage is at a low logic level, the first transistor transmits the first voltage to the voltage dividing circuit, and the voltage dividing circuit divides the first voltage to generate the first divided voltage and the second divided voltage, so that the second divided voltage cuts off the second transistor.

4. The voltage generating device according to claim 1, wherein the first transistor and the second transistor are low-voltage transistors.

5. The voltage generating device according to claim 4, wherein a gate-source breakdown voltage of the low-voltage transistor is less than a high logic level of any of the first voltage and the second voltage.

6. The voltage generating device according to claim 1, wherein the voltage dividing circuit comprises:
   a first diode circuit having an anode that is coupled to the first connection terminal of the voltage dividing circuit;
   a second diode circuit having an anode that is coupled to the second connection terminal of the voltage dividing circuit, wherein a cathode of the second diode circuit is coupled to a cathode of the first diode circuit to provide the first divided voltage; and
   a voltage divider having a first terminal and a second terminal that are coupled to the cathode of the first diode circuit and a reference voltage, respectively, wherein the voltage divider divides the first divided voltage to generate the second divided voltage.

7. The voltage generating device according to claim 6, wherein any of the first diode circuit and the second diode circuit comprises:
   a third transistor having a first terminal that is coupled to the anode, wherein a control terminal of the third transistor is coupled to a second terminal of the third transistor, and the second terminal of the third transistor is coupled to the cathode.

8. The voltage generating device according to claim 6, wherein the voltage divider comprises:
   a first impedance circuit having a first terminal that is coupled to the first terminal of the voltage divider; and
   a second impedance circuit having a first terminal that is coupled to a second terminal of the first impedance circuit to provide the second divided voltage, wherein a second terminal of the second impedance circuit is coupled to the second terminal of the voltage divider.

9. The voltage generating device according to claim 8, wherein the first impedance circuit comprises at least one first diode or at least one first resistor, and the second impedance circuit comprises at least one second diode or at least one second resistor.

10. The voltage generating device according to claim 1, wherein the voltage dividing circuit comprises:
    a first impedance circuit having a first terminal that is coupled to the first connection terminal of the voltage dividing circuit;
    a second impedance circuit having a first terminal that is coupled to the second connection terminal of the voltage dividing circuit; and
    a third impedance circuit having a first terminal that is coupled to a second terminal of the first impedance circuit and a second terminal of the second impedance circuit to provide the first divided voltage and the second divided voltage, wherein a second terminal of the third impedance circuit is coupled to a reference voltage.

11. The voltage generating device according to claim 10, wherein the first impedance circuit comprises at least one first diode or at least one first resistor, the second impedance circuit comprises at least one second diode or at least one second resistor, and the third impedance circuit comprises at least one third diode or at least one third resistor.

12. A radio frequency (RF) device, comprising:
a first transistor having a first terminal that is configured to receive a first voltage;
a second transistor having a first terminal that is configured to receive a second voltage;
a voltage dividing circuit, having a first connection terminal and a second connection terminal that are coupled to a second terminal of the first transistor and a second terminal of the second transistor, respectively, wherein the voltage dividing circuit divides a voltage of at least one of the first connection terminal and the second connection terminal to generate a first divided voltage and a second divided voltage, and the second divided voltage is output as a control voltage to a control terminal of the first transistor and a control terminal of the second transistor;
a voltage regulating unit that is coupled to the voltage dividing circuit to receive the first divided voltage and configured to generate at least one of a positive voltage and a negative voltage related to the first divided voltage; and
an RF circuit that is coupled to the voltage regulating unit to receive at least one of the positive voltage and the negative voltage and configured to control, according to the first voltage, an on state of at least one RF transmission path of the RF circuit.

13. The RF device according to claim 12, further comprising:
a capacitor having a first terminal that is coupled to the voltage dividing circuit to receive the first divided voltage, wherein a second terminal of the capacitor is coupled to a reference potential.

14. The RF device according to claim 12, wherein the voltage regulating unit comprises:
a voltage regulating circuit that is coupled to the voltage dividing circuit to receive the first divided voltage as a power supply voltage and configured to generate a regulating voltage; and
a voltage generating circuit that is coupled to the voltage regulating circuit to receive the regulating voltage and configured to generate the positive voltage and the negative voltage related to the regulating voltage.

15. The RF device according to claim 14, wherein the voltage regulating circuit comprises:
a bandgap circuit having a power supply terminal that is coupled to the voltage dividing circuit to receive the first divided voltage and configured to generate a bandgap voltage; and
a low drop-out voltage regulator that is coupled to the bandgap circuit to receive the bandgap voltage and configured to generate the regulating voltage related to the bandgap voltage.

16. The RF device according to claim 14, wherein the voltage generating circuit comprises:
an oscillator that is coupled to the voltage regulating circuit to receive the regulating voltage and configured to generate a clock signal related to the regulating voltage; and
a charge pump that is coupled to the oscillator to receive the clock signal and configured to generate the positive voltage and the negative voltage according to the clock signal.

17. The RF device according to claim 12, wherein the RF circuit comprises:
a first drive circuit, wherein a first power supply terminal of the first drive circuit is coupled to the voltage regulating unit to receive the positive voltage, a second power supply terminal of the first drive circuit is coupled to the voltage regulating unit to receive the negative voltage, and the first drive circuit is configured to generate a first control voltage related to the first voltage;
a second drive circuit, wherein a first power supply terminal of the second drive circuit is coupled to the voltage regulating unit to receive the positive voltage, a second power supply terminal of the second drive circuit is coupled to the voltage regulating unit to receive the negative voltage, and the second drive circuit is configured to generate a second control voltage related to the second voltage; and
an RF transmission circuit that is coupled to the first drive circuit and the second drive circuit to receive the first control voltage and the second control voltage and configured to control an on state of the at least one RF transmission path according to the first control voltage and the second control voltage.

18. The RF device according to claim 12, wherein the RF circuit comprises:
a drive circuit, wherein a first power supply terminal of the drive circuit is coupled to the voltage regulating unit to receive the positive voltage, a second power supply terminal of the drive circuit is coupled to the voltage regulating unit to receive the negative voltage, and the drive circuit is configured to generate a first control voltage and a second control voltage that are related to the first voltage; and
an RF transmission circuit that is coupled to the drive circuit to receive the first control voltage and the second control voltage and configured to control an on state of the at least one RF transmission path according to the first control voltage and the second control voltage.

19. The RF device according to claim 18, wherein the at least one RF transmission path comprises a first path and a second path, and the RF transmission circuit comprises:
a first RF switch that is configured to provide the first path, wherein a first terminal of the first RF switch is configured to receive an RF signal, a second terminal of the first RF switch is coupled to a first RF transmission terminal of the RF transmission circuit, and a control terminal of the first RF switch is coupled to the drive circuit to receive the first control voltage; and
a second RF switch that is configured to provide the second path, wherein a first terminal of the second RF switch is configured to receive the RF signal, a second terminal of the second RF switch is coupled to a second RF transmission terminal of the RF transmission circuit, and a control terminal of the second RF switch is coupled to the drive circuit to receive the second control voltage.

20. The RF device according to claim 19, wherein the RF transmission circuit further comprises:
a first resistor having a first terminal that is coupled to the first terminal of the first RF switch and the first terminal of the second RF switch, wherein a second terminal of the first resistor is configured to receive a bias voltage;

a second resistor having a first terminal that is coupled to the second terminal of the first RF switch, wherein a second terminal of the second resistor is configured to receive the bias voltage;

a third resistor having a first terminal that is coupled to the second terminal of the second RF switch, wherein a second terminal of the third resistor is configured to receive the bias voltage;

a first switch having a first terminal that is coupled to the second terminal of the first RF switch, wherein a control terminal of the first switch is controlled by the second control voltage, and a second terminal of the first switch is configured to receive the bias voltage; and a second switch having a first terminal that is coupled to the second terminal of the second RF switch, wherein a control terminal of the second switch is controlled by the first control voltage, and a second terminal of the second switch is configured to receive the bias voltage.

\* \* \* \* \*